United States Patent [19]

Sagiv

[11] Patent Number: 4,539,061

[45] Date of Patent: Sep. 3, 1985

[54] PROCESS FOR THE PRODUCTION OF BUILT-UP FILMS BY THE STEPWISE ADSORPTION OF INDIVIDUAL MONOLAYERS

[75] Inventor: Jacob Sagiv, Rehovot, Israel

[73] Assignee: Yeda Research and Development Co., Ltd., Rehovot, Israel

[21] Appl. No.: 530,102

[22] Filed: Sep. 7, 1983

[51] Int. Cl.$^3$ .................. B05D 1/36; B05D 7/00; B32B 7/04; B32B 31/00

[52] U.S. Cl. .................. 156/278; 156/272.2; 156/314; 427/407.1; 427/207.1; 427/35; 428/420

[58] Field of Search .......... 156/310, 278, 314, 272.2, 156/327; 428/420, 354; 427/399, 400, 407.1, 412.3, 412.4, 412.5, 207.1, 36, 35

[56] References Cited

U.S. PATENT DOCUMENTS 4,337,111 6/1982 Kauffman ..................... 156/307.5

OTHER PUBLICATIONS

Katherine B. Blodgett "Films Built by Depositing Successive Monomolecular Layers on a Solid Surface" *J. Am. Chem. Soc.*, Jun. 1935, vol. 57, 1007–1022.

First International Conference on Langmuir-Blodgett Films, Durham, 1982, "Thin Solid Films", Jan. 14, 1983, vol. 99.

W. C. Bigelow, D. L. Pickett and W. A. Zisman, "Oleophobic Monolayers" *J. Colloid Sci.*, vol. 1, Sep. 13, 1946, pp. 513–538.

Katherine B. Blodgett and Irving Langmuir, "Built-Up Films of Barium Stearate and Their Optical Properties", *Physical Review* vol. 51, Jun. 1, 1937, pp. 964–982.

O. Levine and W. A. Zisman, "Physical Properties of Monolayers Adsorbed at the Solid–Air Interface", *J. Phys. Chem.*, vol. 61, Mar. 8, 1957, pp. 1068–1077.

*Primary Examiner*—William A. Powell
*Attorney, Agent, or Firm*—Browdy and Neimark

[57] ABSTRACT

There is provided a process for the production of built up films by the stepwise adsorption of individual monolayers. The process comprises forming a first compact ordered monolayer on a polar solid substrate by adsorption of molecules at a solid fluid interface, and chemically activating the monolayer coated solid in order to introduce polar sites for the anchoring at a further monolayer on the top of the first one, and continuing, if desired, until the desired number of monolayers, one on the other, is obtained. The molecules used are elongated or flattened ones having at one end or side a polar moiety and at the other a non-polar one, which is subsequent to the monolayer formation chemically activated to render it polar and thus adapted to react with another such polar/non polar molecule, and so on.

There may also be provided monolayers of such compounds and there may be inserted a desired functional group at the upper surface of the monolayer molecules to obtain a surface with desired surface properties. The non polar group can also be a non terminal one which is subsequently reacted.

The multilayer films are of value in a wide range of applications, like ultrathin film components in microelectronics, for the production of artificial membranes, in optical devices, ultrathin photoresists, surface coatings with adhesive properties, molecular films useful in solar energy conversion and any other device where ordered ultrathin monolayer or multilayer films are useful and required.

15 Claims, 5 Drawing Figures

PROCESS FOR THE PRODUCTION OF BUILT-UP FILMS BY THE STEPWISE ADSORPTION OF INDIVIDUAL MONOLAYERS

FIELD OF THE INVENTION

There is provided a process based on self-assembling monolayer films as building units for constructing multilayer structures, and as modifiers of surface properties. Adsorption at solid fluid interfaces is used to construct organized oriented compact monolayers of good quality by chemisorption or physisorption, leading to thermodynamically equilibrated film structures. The molecules used for constructing the first monolayer have a terminal polar group and at the other end of the molecule or along said molecule, a non-polar functional group.

According to the invention there is effected a chemical modification of the monolayer coated solid surface in order to introduce polar sites for the anchoring of an additional monolayer on top of the activated one or there may be thus obtained a surface with desired surface properties. A multilayer film can be constructed by repetition of this two-step sequence involving adsorption (chemisorption) followed by chemical activation of the surface for each deposited monolayer.

The invention further relates to the practical application of such multilayer structures for use in various fields of advanced technology, such as microelectronics, optics, ultrathin membranes, ultrathin photoresists, for use in solar energy conversion, adhesion, etc. The invention also relates to substrates coated with such mono or multilayer films of varying nature, produced by the process of the invention.

BACKGROUND OF THE INVENTION

Ordered mono and multilayer films built by the sequential deposition of organic monolayers from a water-gas interface, known as monolayer assemblies [K. B. Blodgett, J. Am. Chem. Soc., 57, 1007 (1935); K. B. Blodgett & I. Langmuir, Phys. Rev., 51, 964 (1937)], or Langmuir-Blodgett (LB) built-up films, have recently become the focus of intensive research aimed at developing novel applications of scientific and technological interest. LB films are considered promising in a wide range of applications, such as: preparation of artificial membranes, fabrication of passive and active ultrathin film components for novel microelectronic and optical devices, ultrathin photoresists, molecular films useful in solar energy conversion, etc. (see Proceedings of the First International Conference on Langmuir-Blodgett Films, Durham (1982), in Thin Solid Films, 99, (1983). The monolayer research has so far advanced according to possibilities offered by the 50 year-old LB monolayer deposition method, which established itself as the standard method presently employed in the preparation of planned monolayer assemblies. In principle, the LB procedure provides a versatile means for the direct handling of monomolecular films, enabling construction of planned layered structures with precise control of the layer sequence, interlayer spacings, and film thickness, down to submolecular dimensions. However, in practice it suffers from some drawbacks and inherent limitations, mainly due to the extensive use of mechanical manipulation in the film building process. This affects the stability, homogeneity, and final structure of the resulting built-up films. Much of the present research effort in this area is expended on the optimization of the LB deposition technique, and on the exploration of ways for improving the stability and tenacity of the films, mainly via polymerization of monomeric film components.

Ordered monolayers similar to those produced by the LB method may be prepared on solids by direct adsorption of appropriate molecules at appropriate solid-fluid interfaces. The study of these so-called oleophobic monolayers (not wetted by organic oils) was pioneered by Zisman and coworkers in the 1950s (W. C. Bigelow et al., J. Colloid Sci., 1, 513 (1946); O. Levine and W. A. Zisman, J. Phys. Chem., 61, 1068 (1957). Zisman's adsorption method is limited to the formation of films of one-monolayer only, which prevents oleophobic monolayers from being employed in the constructio of multilayer film structures resembling the built-up films obtained by the LB technique.

SUMMARY OF THE INVENTION

The invention provides a novel method for the construction of planned monolayer and multilayer assemblies, and for their in-situ chemical modification. The method is based on the direct adsorption (physisorption or chemisorption) of certain types of bifunctional molecules onto suitable solids, at the interface between the solid and a fluid phase containing the monolayer forming molecules. This approach is different in principle from the LB procedure, as no mechanical operations are employed in the process of film formation on the solid, and also from Zisman's method, as the use of bifunctional monolayer components allows ordered multilayer films to be prepared via a sequence of chemical operations performed on the film coated solid. Furthermore, the existence of reactive free functions within monolayer films firmly attached to solid substrates opens the way to the engineering of synthetic organic surfaces with well-defined chemical functionalities, and to the chemical coupling of two monolayer-coated solids (via the chemical derivatization of monolayer coatings and monolayer-to-monolayer binding via reactive terminal groups).

The key step in the novel process comprises first forming a monolayer of molecules having a terminal polar group at one end, and a non-polar one at the other end of the molecule or at any other position along the molecule, and after forming the first compact monolayer by self-assembly on the solid substrate; activating the monolayer by introducing polar sites for the anchoring of an additional monolayer on top of the activated one, of similar nature as the first one; and repeating the activation and application of a further monolayer until the desired number of layers is attained. For example, the activation can be achieved by using bifunctional surfactants provided with a terminal non-polar function that may be chemically modified into a polar group during the activation step.

Bifunctional monolayer-building components should conform to the following general requirements:

Molecules that are structurally compatible with self-association into compact ordered arrays:
   (a) Rod-like molecules containing elongated nonpolar (hydrophobic) moieties, such as derivatives of long chain saturated and unsaturated hydrocarbons and fluorocarbons, steroids, and other elongated polycyclic compounds.
   (b) Disk-like, flattened molecules, such as derivatives of sugars, crown ethers, phthalocyanines, porphyrins, and any other aliphatic or aromatic molecule containing a large cyclic or polycyclic moiety.

Molecules of type (a) or (b) containing one or several polar "head" groups (active groups) that bind to polar solid substrates, and one or several non-polar groups (inert groups) that cannot bind to substrate surfaces or to monolayer covered surfaces, but are chemically convertible into appropriate active groups via appropriate surface reactions performed on the compound in the adsorbed state. The requirement for nonpolar functions exhibiting inert-active dual character is necessary to ensure that the monolayer-to-surface anchoring proceeds through the polar head groups only, that the molecules assume proper orientation in the film and that the adsorption process stops with the completion of a well-defined monlayer film, while providing a route for triggering the continuation of the process under conditions of precise external control.

The monolayer-to-substrate and monolayer-to-monolayer mode of binding may be covalent, ionic, hydrogen bridge, or complex formation, the only special requirement being that the strength of binding be compatible with the conditions of the subsequent chemical reaction employed for the activation of the non-polar function.

Solids suitable as substrates for anchoring self-assembling monolayers should conform to the following requirements: Any solid material exposing a high energy (polar) surface to which monolayer forming molecules can bind by any of the binding modes mentioned above. These may include: metals, metal oxides, semiconductors, glasses, silica, quartz, salts, organic and inorganic polymers, organic and inorganic crystals, etc.

The fluid phase containing the monolayer forming molecules, from which adsorption is performed, may be any fluid, i.e. solutions in organic or aqueous solvents, the melt of the adsorbate, or the vapour phase of the adsorbate.

Typical suitable molecules for use in the construction of such multilayer films are, for example, (a) Normal paraffinic long chain molecules with hydrocarbon chains longer than 12 carbon atoms, containing a transoid ethylenic double bond at any position along the chain, and substituted at one end by anyone of the polar anchoring groups mentioned below; (b) as (a), but partially or fully fluorinated chains, starting with 8 carbon atoms; (c) as (a) or (b), but containing more than one ethylenic double bond; (d) as (a) or (b), or (c), but replacing the double bond by acetylenic triple bond or a terminal diacetylene group; (e) as (c), but replacing one double bond by an acetylene triple bond or a diacetylene group; (f) as (a) or (b), but replacing the double bond by a terminal non-polar function, which may be any of the functional groups listed below; (g) cholestane and cholestene derivatives substituted at one end (position 3 for example) by any one of the polar anchoring groups listed below, and containing an ethylenic or acetylenic group in the paraffinic side chain; (h) as (g) but replacing the double or the triple bond by a terminal non-polar function on the side chain, which may be any of the functional groups listed below; (i) androstane and andrsotene derivatives substituted at one end of the elongated polycyclic backbone by a polar anchoring group and at the other end by a non-polar functional group. The polar and non-polar groups may be any of the groups listed in the respective groups below; (j) phospholipids and glycerol long chain derivatives containing one, two or three paraffinic chains per molecule, substituted at the ends (of one or more of the chains) by any one of the non-polar functional groups listed below; (k) cyclodextrin derivatives provided on one side of the ring with non-polar substituent groups of the type listed below; (l) porphyrines and phthalocyanines substituted with polar anchoring groups and non-polar functional groups as listed below.

Examples of the various types of anchoring the monolayer to the substrate or to other monolayer are, for example:

Anchoring groups (a) Silane moieties: monocholoro, dichloro, trichlorosilanes, silanols, silazanes. Binding via siloxane bridges or hydrogen bridges.
(b) Phosphate group. Binding via ester formation of the phosphate, hydrogen bridges, salt formation.
(c) Sulfate and sulfonic groups. Binding via salt formation, ester formation.
(d) Carboxylic functions (acids, amides, halides, hydrazides). Binding via hydrogen bridges, salt formation, ester formation, amide formation, condensation reactions.
(e) Amino groups, hydrazine group. Binding via salt formation, amide formation, hydrogen bridges, complex formation, condensation reaction.
(f) Hydroxyl groups. Binding via ester formation, hydrogen bridges.
(g) Boronic acid group. Binding via ester formation, hydrogen bridges.
(h) Aldehyde group. Binding via condensation reactions.
(i) Halides. Binding via brganometalic coupling.
(j) Diazonium salt moieties. Binding via diazo-coupling.
(k) Pyridine moieties. Binding via salt formation.

Amongst functional groups at the end of the first monolayer, which are non-polar, there may be mentioned:

Non-polar groups (a) Ethylenic double bonds, terminal and non-terminal.
(b) Acetylene and diacetylene.
(c) Phenyl, chlorobenzene, benzyl halide.
(d) Styrene.
(e) Stilbene.
(f) Ester moieties, secondary and tertiary amides.
(g) Halogen atom
(h) Nitriles (cyano group).
(i) Aldehyde group.

These can be converted by the following examples of chemical methods, into the following types of functional polar groups, or used in the following modes of coupling:

(a) Oxidation of terminal ethylenic double bonds to hydroxyls by hydroboration, or potassium permanganate, or osmium tetroxide.
(b) Oxidation of non-terminal ethylenic double bonds to aldehydes or caboxylic acids by ozone—ozone "cutting" of paraffinic chains at the position of the double bond.
(c) Direct addition of chlorosilanes to terminal ethylenic double bonds or acetylene function.
(d) Hydrolysis of acid derivatives and further coupling via ester, amide linkage, or salt formation.
(e) Aldehyde—amine or hydrazine condensation.

(f) Oxidation of aldehydes or hydroxyls to carboxylic acids, conversion to halides of the acids and condensation with hydrazide groups.

(g) Conversion ot —OH to —O—CN with CNBr and further reaction with amines.

(h) Conversion of halides to Grignard reagents or organo sodium, lithium or copper derivatives, to be further used to couple an additional halogenated hydrocarbon chain.

(i) Coupling of chlorosilanes with halobenzene by the Wurtz-Fitting reaction.

(j) Conversion of aromatic end groups to their Grignard or lithio derivatives and further coupling with halides.

(k) Conversion of terminal acetylenes to their copper derivatives and further reaction with halides ot terminal acetylenes.

(l) Photopolymerization, or $\gamma$ induced, or electron induced interlayer binding of two monolayers or monolayer coated surfaces, contacting each other at the double bond or triple bond (acetylene or diacetylene) planes.

(m) Aromatic substitution with various groups and further binding via various reactions, such as diazocoupling, ester formation, condensation, direct coupling via aromatic substitution.

The invention is illustrated with reference to the following attached figures, in which.

Figure 1:
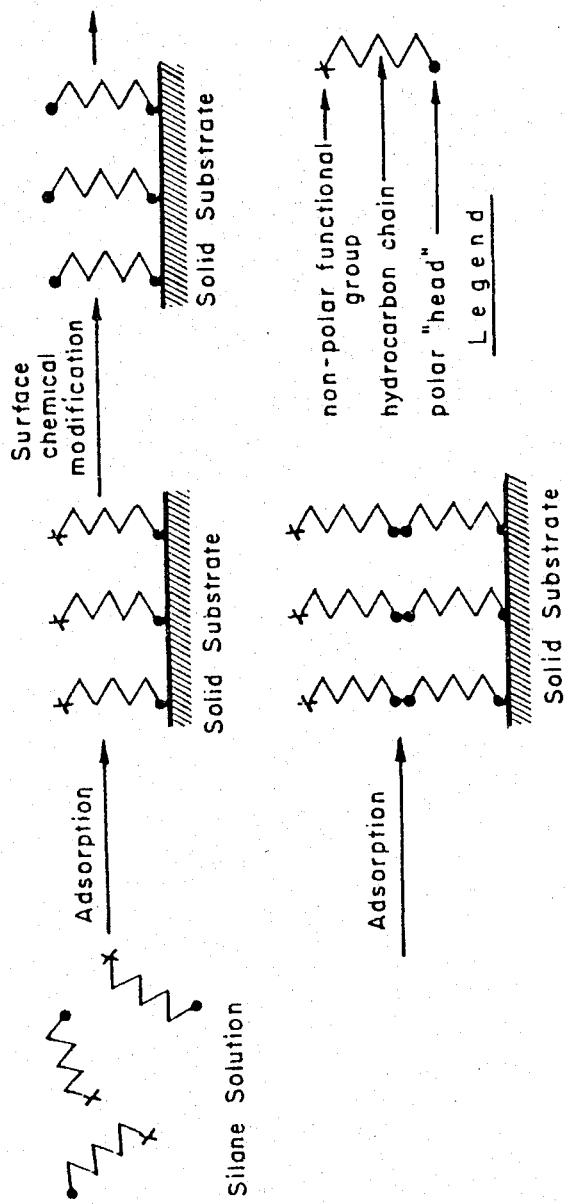
FIG. 1 is a schematic representation of the stepwise formation of an adsorbed multilayer film.
Figure 2:
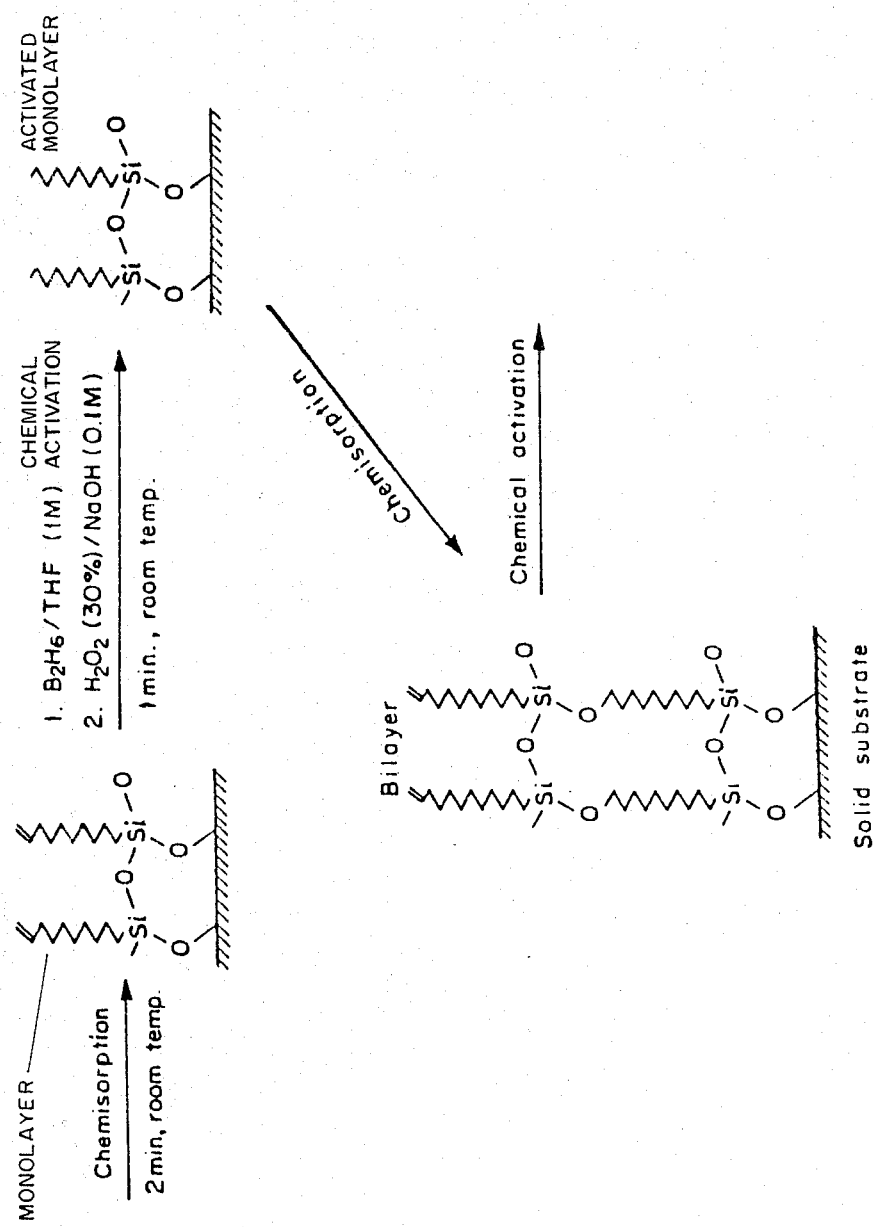
FIG. 2 illustrates multilayer formation by adsorption: binding through the O—Si—O function using bifunctional silane surfactants as monolayer building units.

There can be provided many specific ways for the realization of monolayer and multilayer film structures, and for their chemical modification, according to the general principles formulated above. One particular example involves the use of trichlorosilane-vinyl long chain bifunctional surfactants chemisorbed from organic solutions, covalent binding via the siloxane bridge, and chemical modification of the vinyl function into terminal hydroxyl via the hydroboration reaction. Any other chemical or photochemical reaction found convenient for attaching a particular bifunctional monolayer to a particular substrate, for its chemical modification, or for its coupling to another monolayer or another solid surface, ought to be considered as pertaining to the present invention. Such reactions may be intralayer, interlayer, or at the outer surface of the layer, may involve reagents in liquid, gas, or solid phases, electromagnetic radiation of any wavelength, $\alpha$, $\beta$, $\gamma$ radiation, electron, molecular, or ionic beams, electrochemical processes, catalytic processes, etc. Examples of reactions: oxidations (such as ozonations, permanganate action, etc.), reductions (such as reduction of ketones by sodium borohydride, etc.), condensations (such as amine-aldehyde, etc.), aromatic substitutions, ester and amide bond formation or hydrolysis (including esters of acids such as phosphoric, boric, boronic, sulfuric, sulfonic, etc.), salt formation, hydrogen bonding, complexations, polymerizations (intralayer and interlayer), organometalic couplings (including metals in the gas phase such as Grignard reactions with gaseous Mg), etc.

The general methods described above are useful in the following areas: construction of passive or active thin film elements for microelectronic and optical devices (such as thin film organic insulators, conductors, semiconductors), artificial membranes, ultrathin protective coatings (particularly useful for preserving the quality and performances of optical surfaces), photoactive films (useful for solar energy conversion, photography, or other purposes), photoresists, preparation of surfaces with planned properties such as repellent surfaces (for water, oils, etc.), biocompatible surfaces for medical applications, preparation of adsorbers with planned properties in novel separation techniques (batch and continuous column chromatographic separations).

The method of the invention may also be used for the production of monolayers with desired surface properties. When there is applied to a suitable substrate a monolayer of the type defined above, the non-polar groups or the unsaturated functionality may be modified subsequently so as to impart to the layer, and thus to the surface, desired new properties, Amongst other uses this may be used for bonding together two such surfaces or for other adhesive effects. Surfaces according to the invention, of varying complementary properties, can be used for the bonding together of composite materials. Suitable complementary groups are for example aldehyde and amino groups; also hydrazide and acyl-halide groups may be used. The novel process can be obtaining a layer having catalytic properties.

There may be coupled to the surfaces by such means biologically active compounds, such as proteins (enzymes, antigens or the like).

As practically any desired type of functional groups can be obtained from the non-polar groups, and as such groups can be used for a very wide, practically unlimited scope of coupling reactions, it is clear that thus there may be obtained surfaces with nearly any desired functional group type or functionality.

The following example illustrates the invention, and is to be construed in a non-limitative manner.

EXAMPLE

STEP A: Synthesis of the silane bifunctional surfactants

In order to study the influence of the hydrocarbon chain length on the monolayer forming properties of the silane surfactants we looked for synthetic methods for the preparation of compounds with variable chain lengths, a terminal double bond and another terminal functional group convertible into the —$SiCl_3$ moiety. It was found convenient to start with the commercially available 10-undecenyl alcohol and to proceed along the synthetic route summarized as follows:

Repetition of steps C, A and B before step D leads to further addition of two or three carbon atoms for the hydrocarbon chain.

The chlorination step A was carried out according to the method of Hooz and Gilani (J. Hooz and S. S. H. Gilani, Can. J. Chem., 46 (1968), 86) using either tri-n-butyl phosphine or triphenyl phosphine. The Grignard reaction B was conducted iin tetrahydrofuran (THF) with dibromoethane as entraining agent. Ethylene oxide or trimethylene oxide was added dropwise with ice cooling to the Grignard reagent (step C); the mixture was then stirred at room temperature for 24 h, refluxed for another 2 h and finally quenched with a saturated aqueous solution of $NH_4Cl$. Step D was performed by dropwise addition of the Grignard reagent to a magnetically stirred solution of $SiCl_4$ (in excess) in benzene. After stirring at ambient temperature for 2 h the mixture was refluxed for another 2 h, the solid material ($MgCl_2$) was then separated by centrifugation and the final product was vacuum distilled in a rotating-ball tube oven.

The following compounds were synthesized: UTS, 10-undecenyltrichlorosilane (11 carbon atoms; 110° C., 20 Torr); TTS, 13-tetradecenyltrichlorosilane (14 carbon atoms; 120° C., 0.2 Torr); PTS, 14-pentadecenyltrichlorosilane (15 carbon atoms; 150° C., 0.2 Torr); HTS, 15-hexadecenyltrichlorosilane (16 carbon atoms; 85°–90° C., 0.03 Torr). All intermediates and final products (oils at room temperature) were characterized by nuclear magnetic resonance (NMR) and IR spectroscopy. Bands typical of long-chain trichlorosilanes with n carbon atoms and a terminal ethylenic double bond were observed by NMR ($CDCl_3$) at chemical shifts $\delta$ of 6.0–5.58 (multiplet, 1H), 5.10–4.84 (multiplet, 2H) and 2.1–1.0 (multiplet, (2n–4)H, strong peak at 1.27) and by IR (neat on a germanium window) at 2926 $cm^{-1}$ (very strong), 2854 $cm^{-1}$ (very strong), 1651.5 $cm^{-1}$ (weak), 1466 $cm^{-1}$ (medium), 993 $cm^{-1}$ (weak) and 909.5 $cm^{-1}$ (medium). Partial migration of the terminal double bond occurred during the final distrillation of PTS, as indicated by the appearance of non-vinylic bands at $\delta = 5.35$ (multiplet) in the NMR spectrum and 966 $cm^{-1}$ (weak) in the IR spectrum. This points to an instability of the terminal double bond at temperature higher than 120° C.

STEP B: Monolayer formation, surface chemical modification and multilayer formation The adsorption step Monolayers were chemisorbed at ambient temperature from stirred solutions of the silane compounds concentration, froim $2.0 \times 10^{-3}$ to $5.0 \times 10^{-2}$M) in a solvent mixture of 80%n-hexadecane-12%$CCl_4$-8%$CHCl_3$ (J. Sagiv, J. Am. Chem. Soc. 102 (1980), 92). All solvents were passed through columns of alumina (Woelm-Pharma, W200 super, basic) and the chloroform was stabilized with absolute ethanol (1 vol.%). The solid substrates were immersed in the silane solutions for 1–2 min, with a subsequent quick withdrawal. Good monolayers were considered to be formed only on those substrates emerging dry from the silane solution (oleophobic)(Ibid.) The monolayer-covered substrates were rinsed with chloroform and distilled water, to ensure stability of the formed films.

The surface activation step

The modification of the outer vinylic groups into terminal hydroxyls was accomplished using the following procedure. Film-coated substrates were dipped for 1 min into a solution of diborane in THF (1M, Aldrich) kept under dry argon at room temperature, were then dipped for 1 min into an alkaline hydrogen peroxide solution (30% $H_2O_2$ in 0.1M Aqueous NaOH) and finally were rinsed with distilled water and dried in a stream of air.

Multilayers

Deposition of additional monolayers was performed by repeating the adsorption and chemical modification steps in the same manner as described above.

Preparation of the substrates

The solid substrates employed in this work were glass slides, mirrors of aluminium evaporated on glass slides, and silicon ATR plates. The glass slides were cleaned ultrasonically for about 15 min in a boiling ethanol:-chloroform mixture (1:1 by volume), rinsed with chloroform, dried in a stream of air and, before use, plasma treated for about 15 min in an r.f. argon plasma (Harrick PDC-3xG plasma cleaner).

Aluminium (wire, 99.99% pure) was slowly evaporated on cleaned glass slides from a distance of 25 cm using an Edwards coating system at $10^{-5}$–$10^{-6}$ Torr. The aluminium mirrors were plasma cleaned before coating with monolayer films as well as before blank measurements were performed. The silicon ATR plates were cleaned using the same procedure as was described for the glass slides. Their degree of cleanness was monitored by IR specgroscopy (disappearance of the strong C—H stretching bands around 2900 $cm^{-1}$) before monolayer coating. The removal of monolayer films from the silicon plates for their reuse required prolonged exposure to oxygen and argon plasma treatments.

Wettability measurements

Advancing contact angles for n-hexadecxane and $H_2O$ were measured under ambient conditions with an NRL contact angle goniometer (Rame-Hart 100) using the sessile drop method. The reported data refer to maximal values observed on the respective samples, and the precision of the measurements is of the order of $\pm 1°$ for n-hexadecane and $\pm 2°$ for $H_2O$.

Ellipsometric measurements

The ellipsometric measurements were performed according to the method described in F. L. McCrackin et al. J. Res. Natl. Bur. Stand., Sect. A, 67 (1963), 363, with a Rudolph research instrument (model 433) set at an angle of incidence of 64.10°. The 5461 A green line of a mercury lamp was used as the light source.

IR measurements

The IR measurements were performed with a single-beam Fourier transform IR spectrophotometer (Nicolet MX-1). All reported spectra represent net absorbances due to the deposited surface films and were obtained by mathematical subtraction of the curves recorded with the clean substrates from the curves recorded after coating the substrates with the respective films.

A Harrick variable-angle multiple-internal-reflection (ATR) attachment set at an angle of incidence of 45° was used for recording the ATR spectra. The internal reflection elements were silicon single-pass plates (45°, 50 mm $\times$ 5 mm $\times$ 3 mm, 17 reflections). The multiple-external-reflection-absorption (RA) spectra were recorded using two parallel Al/glass mirrors (76 mm $\times$ 13 mm) separated by a spacer 3 mm thick mounted into the same accessory as was used for the ATR measurements. The angle of incidence was set at the maximal value possible with this attachment (75°), and the mirrors were displaced laterally with respect to each other by 11 mm. Using this configuration the IR radiation beam (diameter, 7 mm) is almost entirely reflected between the mirrors, resulting in complete coverage of their surface with a minimal number of reflections (seven or eight). This ensures recording of the spectra under optimal signal/noise conditions. The contact angles measured on monolayers of the presently synthesized silanes adsorbed on glass slides are listed in Table 1. As seen from Table 1, undecenyltrichlorosilane (UTS) does not show the ability to form oleophobic monolayers, most probably because its hydrocarbon chain is too short to yield oriented structures. All other compounds do form oleophobic monolayers, with pentadecenyltrichlorosilane (PTS) exhibiting lower contact angles than tetradecenyltrichlorosilane (TTS) and hexadecenyltrichlorosilane (HTS). This indicates a lower degree of organization in PTS monolayers, presumable due to the steric disorder caused by the partially isomerized double bonds (L. Netzer et al. Thin Solid Films, 99 (1982), 235). TTS and HTS show similar advancing contact angles, but while hysteresis for n-hexadecane is pronounced on TTS it is hardly observable on HTS monolayers. Comparing also the contact angles of HTS with those of OTS (n-octadecyltrichlorosilane) monolayers we may conclude that HTS forms the monolayers with the highest degree of chain density and order within the series of presently synthesized silanes without, however, reaching the highest value possible for monolayers of this type. This suggests that longer chains are required (18–20 carbon atoms) to obtain bifunctional silane monolayers of the same quality as OTS or 17-octadecenoic acid films.

TABLE I

ADVANCING CONTACT ANGLES MEASURED ON SILANE MONOLAYERS ADSORBED ON GLASS

| Test Liquid | Contact angle | | | | |
|---|---|---|---|---|---|
| | OTS ($C_{18}$, saturated) | HTS ($C_{16}$) | PTS ($C_{15}$) | TTS ($C_{14}$) | UTS ($C_{11}$) |
| n-hexadecane | 45° | 40° | 38° | 40° | Spreads |
| $H_2O$ | 110° | 105° | 97° | 105° | 90° |

Multilayer formation and structure
Multilayers on glass

Table II gives the contact angles measured on a growing HTS film on glass. The expected periodicity in the contact angle values, reflecting the alternating polar-non-polar character of the film's outer surface during the two-step monolayer deposition process is actually observed.

TABLE II

ADVANCING CONTACT ANGLES MEASURED ON A GROWING MULTILAYER FILM ON GLASS

| | Contact angle | | | | | | | | |
|---|---|---|---|---|---|---|---|---|---|
| | First layer | | Second layer | | Third layer | | Fourth layer | | Fifth layer |
| Test liquid | HTS | HTS activated | HTS | HTS activated | HTS | HTS activated | HTS | HTS activated | OTS |
| n-hexadecane | 40° | 0° | 37° | 0° | 32° | 0° | 26° | 0° | 45° |
| $H_2O$ | 105° | 50° | 99° | 50° | 96° | 50° | 94° | 50° | 107° |

(OTS) monolayers exposed to the same sequence of treatments as HTS showed no change in their wetting properties, thus proving the stability of silane films under the conditions of the hydroboration reaction. The monotonic decrease in the contact angles with increasing number of monolayers in the growing HTS film reflects a tendency of deterioration of the molecular organization within each additional monolayer, probably as a result of accumulation of defects and structural irregularities. The high contact angles exhibited by the fifth OTS layer are in remarkable contrast with the general tendency observed for HTS films. This demonstrates the ability of OTS to bridge over irregularities and to form good monolayers even on molecularly "rough" surfaces. This interpretation is sustained by the observed inability of TTS and PTS to form oleophobic multilayer films, while good OTS/TTS and OTS/PTS bilayers could be produced without difficulty.

Mutilayers on silicon

Figure 3:
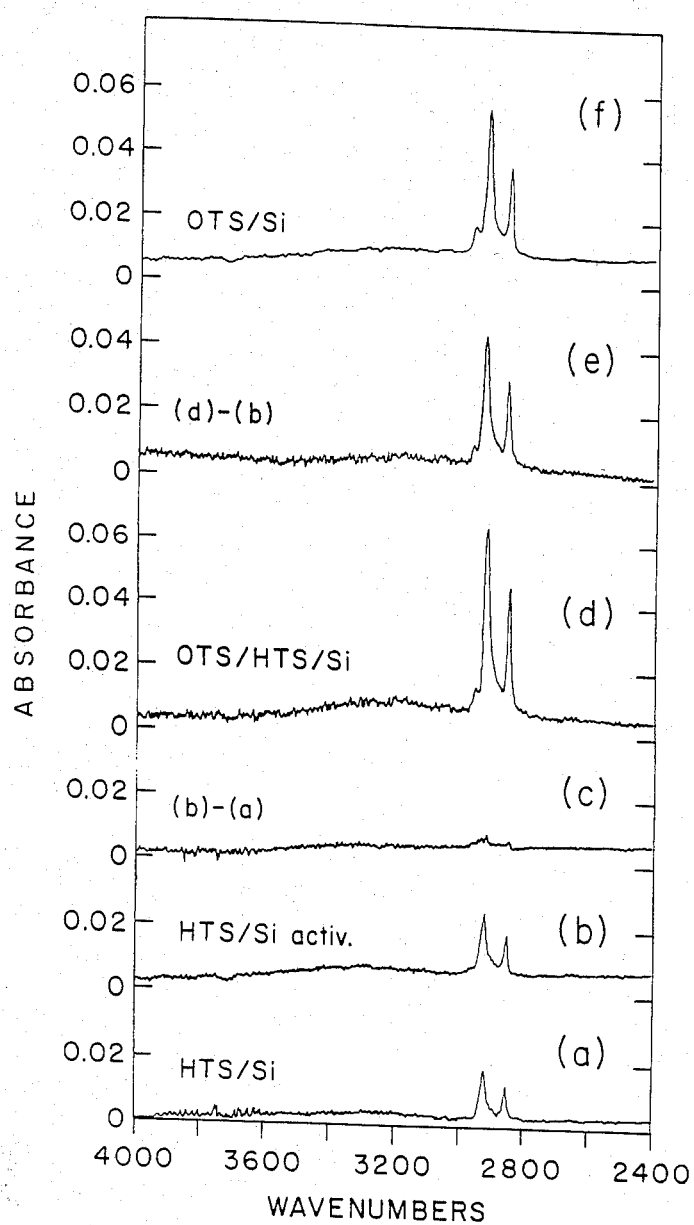
FIG. 3 illustrates IR ATR spectra for layers on silicon plate (45°, 17 reflections) measured with a Nicolet MX-1 Fourier transform spectrophotometer: (a) HTS/Si monolayer; (b) HTS/Si activated monolayer; (c) subtraction (b)−(a); (d) OTS/HTS/Si bilayer; (e) OTS second monolayer, subtraction (d)−(b); (f) OTS/Si monolayer. OTS is n-octadecyltrichlorosilane, HTS is 15-hexadecenyltrichlorosilane.
Figure 4:
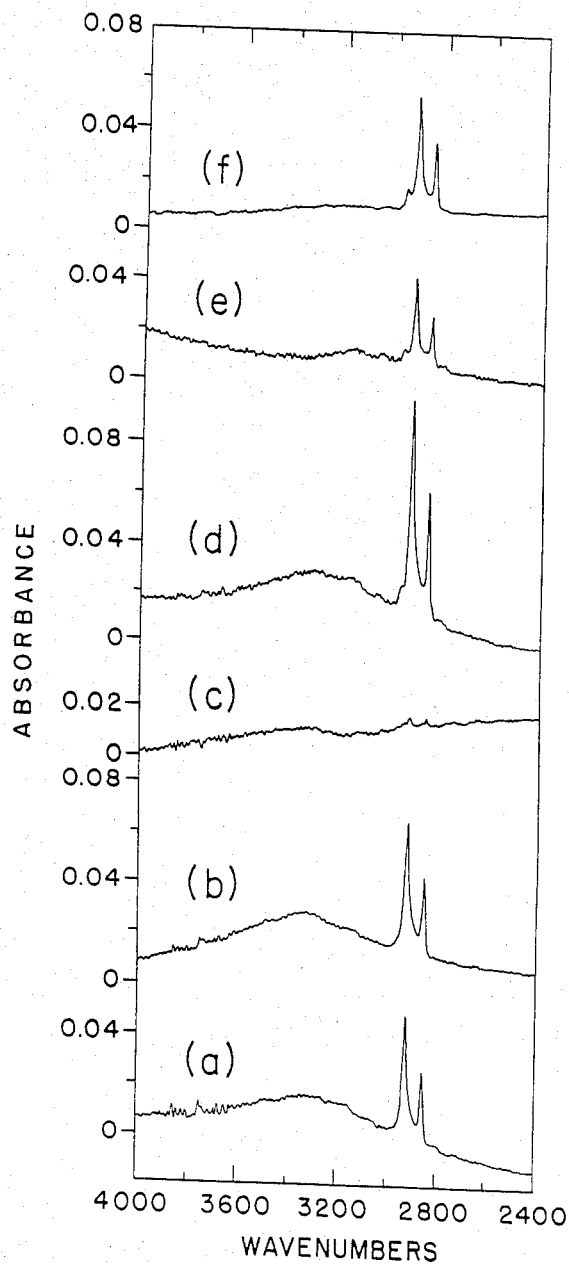
FIG. 4 illustrates Spectra as in FIG. 3 for the following structures: (a) HTS/HTS/Si bilayer; (b) HTS/HTS/Si activated bilayer; (c) subtraction (b)−(a); (d) OTS/HTS/HTS/Si trilayer; (e) OTS third monolayer, subtraction (d)−(b); (f) OTS/Si monolayer.

All data reported in the following, including contact angles, ATR and ellipsometric measurements, were obtained using the same ATR plate. The IR spectra recorded after each step during formation of a bilayer and a trilayer film are depicted in FIG. 3 and FIG. 4 respectively. The corresponding ellipsometric readings are plotted in FIG. 5 and the contact angles are listed in Table III.

The relationship between the ellipsometric angles $\Delta$ and $\psi$ and the film thickness is approximately linear for film thicknesses in the range from 0 to about 100 Å.

TABLE III

ADVANCING CONTACT ANGLES MEASURED ON GROWING MULTILAYER FILMS ON SILICON

| Film | Contact angle | | FIGS. |
|---|---|---|---|
| | n-hexadecane | $H_2O$ | — |
| HTS/Si | 35° | 100° | 3(a), 5 |
| HTS/Si activated | 0° | 48° | 3(b) |
| OTS/HTS/Si | 45° | 108° | 3(d), 5 |
| HTS/Si | 40° | 105° | — |
| HTS/Si activated | 0° | 50° | — |
| HTS/HTS/Si | 34° | 98° | 4(a), 5 |
| HTS/HTS/Si activated | 0° | 50° | 4(b) |
| OTS/HTS/HTS/Si | 44° | 105° | 4(d), 5 |
| OTS/Si | 46° | 111° | 3(f), 4(f), 5 |

Figure 5:
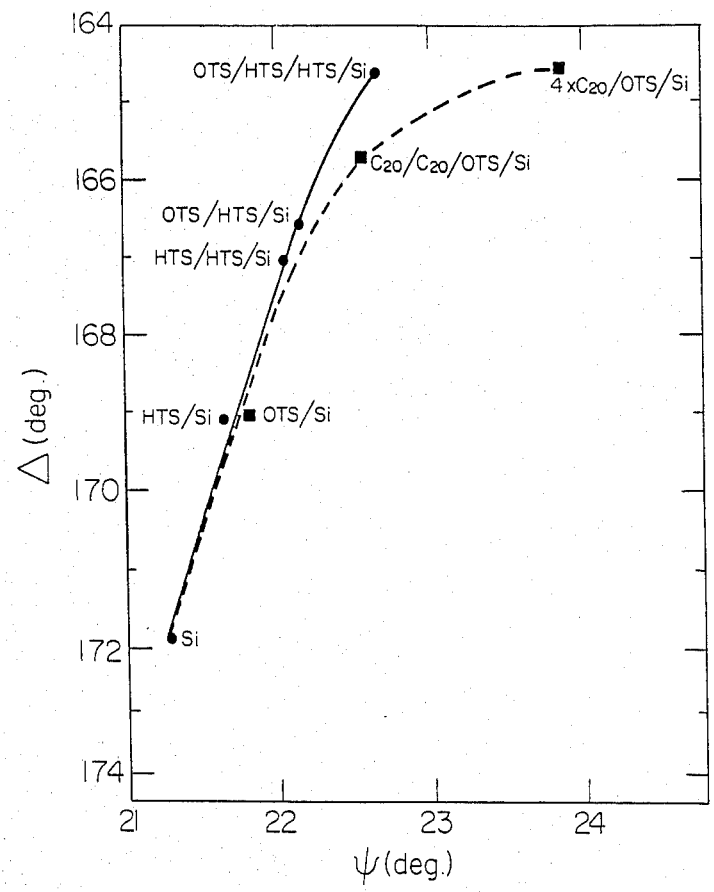
FIG. 5 is a plot of experimental vs. readings from ellipsometric measurements on silicon:__, adsorbed silane films; - - - , LB films of $Cd^{2+}$ arachidate ($C_{20}$) deposited onto an adsorbed OTS monolayer.

This gives the possibility to monitor the growing process of films up to a total thickness of the order of three monolayers in a straightforward manner, directly from the experimental $\Delta$ versus $\psi$ plots (R. Iscovici et al. A comparative study of adsorbed and LB monolayers, to be published). The $\Delta$ versus $\psi$ plots in FIG. 5 are consistent with the monolayer-by-monolayer growth in thickness of the respective silane films. Since the slope of such plots is strongly dependent on the refractive index of the film, which in turn depends on the nature of the film's constituent molecules (the polar head and length of the hydrocarbon chain) and on their orientation and density, the points for OTS and HTS may be expected to fall on slightly different curves. This can be seen indeed in FIG. 5 as a small displacement of the HTS and OTS monolayer points with respect to the common curve and a slight bending of the curve at the OTS/HTS/HTS/Si point. The broken line, representing two and four monolayers of cadmium arachidate (acid with 20 carbon atoms) transferred by the LB method on top of a first OTS monolayer, was included to illustrate the strong non-linearity of the versus plot for relatively large differences in the refractive index and total film thicknesses in excess of 100 Å.

The quantitative analysis of the ATR data (summarized in Table IV) confirms the conclusions derived from the observed contact angles (Tables II and III) regarding the gradual deterioration of molecular organization with increasing thickness of the film and the better quality of OTS as compared with HTS monolayers. Thus, the density of molecules per unit film area calculated from the peak intensity of the antisymmetric methylene stretching band at 2918.5 cm$^{-1}$, and expressed as the percentage of surface coverage relative to the OTS/Si monolayer (standard for maximal possible coverage (Ibid.), decreases in the order expected from the respective contact angles (see Table III).

TABLE IV

DENSITY OF MOLECULES IN ADSORBED FILMS ON SILICON RELATIVE TO THAT FOR A CLOSELY PACKED OCTADECYLTRICHLOROSILANE MONOLAYER[a]

| Film | Adsorbance per-CH$_2$—group at 2918.5 cm$^{-1}$ ($\times 10^3$) | Relative surface coverage (%) | FIGS. |
|---|---|---|---|
| OTS first layer = OTS/Si | 2.61 | 100 | 3(f), 4(f) |
| OTS second layer = (OTS/HTS/Si)—(HTS/Si activated) | 2.23 | 85 | 3(e) |
| OTS third layer = (OTS/HTS/HTS/Si)—(HTS/HTS/Si activated) | 2.06 | 79 | 4(e) |
| HTS/HTS/Si | 1.82 | 70 | 4(a) |
| HTS/HTS/Si activated | 1.84 | 71 | 4(b) |
| HTS/Si | 1.64 | 63 | 3(a) |
| HTS/Si activated | 1.63 | 62 | 3(b) |

[a]Data calculated from IR ATR spectra

The feasibility of the novel multilayer deposition method has been established beyond any doubt. All experimental evidence points to a strong sensitivity of the method to the degree of order attainable in the first adsorbed monolayer. Defects and disordered regions tend to propagate from layer to layer in multilayer films built of intrinsically imperfect monolayers. This leads to the accumulation of defects and to rapid deterioration of the film organization with increasing number of monolayers. However, compounds forming high quality monolayers (perfect orientation and close packing of the hydrocarbon chains) may bridge over molecular irregularities and prevent the propagation of defects from layer to layer. Thus, while TTS (14 carbon atoms) does not show the ability to form oleophobic films thicker than one monolayer, the addition of only two carbon atoms to the hydrocarbon chain suffices to improve the monolayer quality to an extent that permits the adsorption of up to four oleophobic HTS (16 carbon atoms) monolayers on top of each other. Finally, OTS (18 carbon atoms, saturated chain) did form very good monolayers on top of all the monolayer and multilayer films studied, regardless of their quality. These observations indicate that the length of the hydrocarbon chains plays a key role in the formation of oriented and compact monolayer structures. It is therefore expected that bifunctional silanes longer than HTS by two to four carbon atoms yield organized multilayer films in which the basic monolayer structure is preserved indepndent of thetotal number of deposited monolayers of their location within the film. Thus it is possible to construct high quality adsorbed films of any desired thickness.

I claim:

1. A process for the production of a plurality of monolayer structures one on the other, which comprises forming on a suitable substrate a compact ordered monolayer of molecules selected from the group consisting of molecules having an elongated configuration and molecules having a flattened configuration, with at least one functional group adapted to be attached to the substrate at one end or side, respectively, of the molecule, and at least one non-polar group at another position along said molecule, converting, after formation of said monolayer, said non-polar groups to polar functional groups which are of a reactive nature and continuing the formation of further layers until the desired number of layers is obtained.

2. A process according to claim 1, wherein the reactive groups are selected from the group consisting of silane groups, monochlorosilanes, dichlorosilanes, trichlorosilanes, silanols, silazanes; phosphate groups, sulfate groups, sulfonic groups, carboxylic groups, amides, acyl halides, hydrazides, amine moieties, hydrazine moieties, hydroxy groups, aldehyde groups, boronic acid groups, halides, diazonium salt groups, and pyridine groups.

3. A process according to claim 1, wherein the non-polar groups are selected from the group consisting of ethylenic, acetylenic, terminal and non-terminal diethylenic and diacetylenic double and triple bonds, phenyl, halobenzene, benzyl chloride, styrene, stilbene, ester, secondary and tertiary amine, halide, nitrile, and aldehyde groups.

4. A process according to claim 2 wherein the conversion of non-polar groups to polar ones is achieved by effecting oxidation of terminal ethylenic double bonds to hydroxy groups, hydroboration, permanganate or osmium tetroxide.

5. A process according to claim 1, wherein the molecules used are selected from the group consisting of substituted normal paraffinic long chain molecules, substituted fluorinated long chain paraffinic molecules, substituted cholestane or androstane derivatives, phospholipids derivatives, glycerol long chain derivatives, cyclodextrin derivatives, and porphyrins derivatives, phthalocyanines derivatives, crown ether derivatives.

6. A process according to claim 1, wherein the conversion of polar groups is achieved by effecting or gamma-ray induced, or electron induced interlayer binding of two monolayers or monolayer-coated surfaces, contacting same at the double bond or triple bond planes.

7. A process according to claim 1 further comprising the step of establishing, on said layer, a second layer of said molecules and converting the non-polar groups of said second layer of said molecules to reactive groups.

8. A process according to claim 1, wherein the conversion of polar groups is achieved by effecting oxidation of non-terminal ethylenic double bonds to adlehyde or carboxy groups by ozone, resulting in cutting off of paraffinic chains at the location of the double bond.

9. A process according to claim 1, wherein the conversion of polar groups is achieved by effecting direct addition of chlorosilanes to terminal ethylenic double bonds or acetylenic functions.

10. A process according to claim 1, wherein the conversion of polar groups is achieved by effecting hydrolysis of acid derivatives and coupling via ester or amide linkages or salt formation.

11. A process according to claim 1, wherein the conversion of polar groups is effected by aldehyde amine condensation.

12. A process according to claim 1, wherein the conversion of polar groups is effected by oxidation of aldehyde or hydroxy groups to carboxylic acid groups, conversion to acid halides and condensation with hydrizide groups.

13. A process according to claim 1, wherein the conversion of polar groups is effected by conversion of hydroxy groups to —O—CN groups with cyanobromide and reaction with amines.

14. A process according to claim 1, wherein the conversion of polar groups is achieved by effecting conversion of halides or phenyl to Grignard reagents or organo sodium, lithium or copper derivatives and coupling with halogenated hydrocarbon chains.

15. A process according to claim 1, wherein the conversion of polar groups is achieved by effecting coupling via substitution.

* * * * *